United States Patent
Jin et al.

(10) Patent No.: US 7,170,343 B2
(45) Date of Patent: Jan. 30, 2007

(54) FAST LUT PREDISTORTER FOR POWER AMPLIFIER

(75) Inventors: Ming-Lu Jin, Shenyang (CN); Soo-Young Kim, Daejon (KR); Seong-Pal Lee, Daejon (KR); Do-Seob Ahn, Daejon (KR); Deock-Gil Oh, Daejon (KR); Jae-Moung Kim, Daejon (KR)

(73) Assignee: Electronics and Telecommunications Research Institute (KR)

( * ) Notice: Subject to any disclaimer, the term of this patent is extended or adjusted under 35 U.S.C. 154(b) by 46 days.

(21) Appl. No.: 10/856,240

(22) Filed: May 27, 2004

(65) Prior Publication Data

US 2005/0140438 A1 Jun. 30, 2005

(30) Foreign Application Priority Data

Dec. 27, 2003 (KR) ............................ 2003-0098393
Feb. 5, 2004 (KR) ............................ 2004-0007652

(51) Int. Cl.
*H03F 1/26* (2006.01)
(52) U.S. Cl. ..................................................... 330/149
(58) Field of Classification Search ................ 330/149, 330/296; 455/114.3
See application file for complete search history.

(56) References Cited

U.S. PATENT DOCUMENTS 5,049,832 A 9/1991 Cavers
5,903,611 A * 5/1999 Schnabl et al. ............. 375/297
5,929,703 A 7/1999 Sehier et al.
6,072,364 A 6/2000 Jeckeln et al.
6,928,122 B2 * 8/2005 Opas et al. ................. 375/296
2004/0142667 A1 * 7/2004 Lochhead et al. ........ 455/114.3

FOREIGN PATENT DOCUMENTS

KR       010083262 A    9/2001
KR   1020010083262       9/2001

OTHER PUBLICATIONS

IEEE Transactions on Communications, vol. 45, No. 10, Oct. 1997, pp. 1167-1171.
The 14th IEEE 2003 International Symposium on Personal, Indoor and Mobile Radio Communications, 7 pages.
The 8th International Conference on Cellular and Intelligent Communication, 7 pages.
"An Adaptive Data Predistorter for Compensation of Nonlinear Distortion on OFDM Systems", W. Jeon, et al., IEEE Transactions on Communications, vol. 45, No. 10, Oct. 1997.

(Continued)

*Primary Examiner*—Robert Pascal
*Assistant Examiner*—Hieu Nguyen
(74) *Attorney, Agent, or Firm*—Blakely Sokoloff Taylor & Zafman

(57) ABSTRACT

A fast LUT predistortion apparatus and method for compensating nonlinear distortion of the high power amplifier HPA is disclosed. The apparatus includes a predistortion unit for predistorting an input complex digital signal based on a look up table LUT implementation and outputting a predistorted complex signal; and a power amplifier for amplifying the predistorted signal and outputting an amplified complex signal.

8 Claims, 6 Drawing Sheets

OTHER PUBLICATIONS

"A Fast LUT Predistorter for Power Amplifier in OFDM Systems", M. Jin, et al., IEEE 2003 Symposium on Personal, Indoor, and Mobile Radio Communications, Sep. 7-10, 2003, 7 pages.

"A New Error Functions in the Complex Gain Predistorter", M. Jin, et al., The 8th International Conference on Cellular and Intelligent Communications, Oct. 28-31, 2003, 7 pages.

* cited by examiner

FAST LUT PREDISTORTER FOR POWER AMPLIFIER

FIELD OF THE INVENTION

The present invention relates to a linearization method and an apparatus for a high power amplifier HPA used for data transmission in digital communication systems; and, more particularly, to a fast Look Up Table LUT predistortion method and an apparatus for compensating nonlinear distortion of the high power amplifier.

DESCRIPTION OF RELATED ARTS

Continuing pressure on the limited spectrum availability is forcing the development of spectrally efficient linear modulation methods, such as M state Quadrature Amplitude Modulation M-QAM and Phase Shift Keying PSK. Since their modulated signal envelopes fluctuate, the linear modulation methods generate nonlinear distortion as inter-modulation products at a nonlinear power amplifier output. In the mobile environment, restriction on the out-of-band emissions is stringent and linearization of the amplifier is desirable.

To reduce the nonlinear distortion such as inter-modulation products, a number of linearization technologies have been developed. Among the linearization technologies, a predistortion technology has been the most common approach developed in new systems today. A device capable of predistortion can be digitally designed by using a look-up table (LUT) based on Cartesian or polar representation of signals.

An earlier LUT implementation of predistortion called as mapping predisposition was introduced in an article by Nagata, entitled "Linear Amplification Technique for Digital Mobile Communications", in *proc. IEEE VTC'*1989, Sans Francisco, Calif., pp. 159–164, which is referred to Nagata's method.

The mapping predistorter has several advantages because it can incorporate any order of non-linearity and it is applicable to any modulation technique.

The Nagata's mapping predistorter was implemented with two dimensional look up table LUT and to get an acceptable accuracy, the size of the look up table has to be larger. Therefore, the major drawback with the mapping predistorter is the large size of the look-up table, which results in long adaptation time for convergence to the inverse function of the power amplifier.

Therefore, in order to increase the rate of convergence and to reduce the complexity, several adaptive LUT predistorters have been proposed.

For example, a complex gain LUT based predistortion method is disclosed in U.S. Pat. No. 5,049,832, issued to Cavers et al., entitled "Amplifier Linearization by Adaptive Predistortion". The key idea of the complex gain LUT based predistortion method is that the LUT is implemented with one dimensional table and the update of LUT contents is treated as root finding problem with a secant method. This has made possible that less memory is needed and therefore, the convergence time has been reduced compare to the Nagata's method.

A LUT based predistortion method is, deisclosed in U.S. Pat. No. 6,072,364 issued to Jeckein et al., entitled "Adaptive Digital Predistortion for Power Amplifiers with Real Time Modeling of Memoryless Complex Gains", which is referred to as Jeckeln's method.

In Jeckeln's method, a forward function of HPA are estimated by a line or cubic interpolation method based on set of samples of input and output of power amplifier and then an inverse function of power amplifier is obtained by direct inverse mapping of the forward function of HPA. Thus an update operation is performed in a block manner, so that it is possible to eliminate the convergence time and the need for an iterative algorithm for every sample of input and output signal. However, the Jeckeln's method is sensitive to a measurement error because there is no adaptive compensation process for estimating the forward function of HPA.

Another LUT based predistortion method, which is similar to the Jeckeln's method is disclosed in U.S. Pat. No. 5,929,703, issued to Sehier et al., entitled "Method and Device for Modeling AM-AM and AM-PM Characteristics of an Amplifier, and Corresponding Predistortion", which is referred to Sehire's method.

In the Sehire's method, a reference signal is used to get set of samples of input and output of power amplifier and a curve fitting operation is performed by polynomial function. By this way, it is possible to fasten the initial convergence rate of the LUT predistorter. However, the computational complexity of Sehire's method is increased by the curve fitting operations and the Sehire's method is also sensitive to the defect of the systems which introduce measurement errors.

Still another LUT based predistortion method is disclosed in Korean patent No. 10-0315425, entitled "Apparatus and Method for High Speed Adaptive predistortion Using Lookup Table". In this patent application, first, the forward function of HPA is approximated by set of samples of input and output of the power amplifier and then, it is updated by a least mean-square (LMS) iterative algorithm. The inverse function of power amplifier, i.e. LUT contents, is obtained directly from the inverse mapping of the forward function of the power amplifier. However, this method is also sensitive to the defect of the systems in initializing process as the previous patent.

A broadcasting technique to increase an initial convergence rate of LUT contents is disclosed in an article by Won-Gi Jeon, Kyung-Hi Chang and Yong-Soo Cho, entitled "An Adaptive Data Predistorter for Compensation of Nonlinear Distortion in OFDM systems", *IEEE Transaction on communications*, Vol. 45, No. 10, pp. 1167–1171, October 1997, wherein referred to as Jeon's method. The Jeon's method also used a reference signal, generated in local, to fasten the convergence rate of the LUT. The Jeon's method is based on adaptive update algorithm concerned to inverse function of power amplifier instead of forward function of the power amplifier as previous patents.

SUMMARY OF THE INVENTION

It is, therefore, an objective of the present invention to provide a fast look up table predistortion apparatus for making an initial convergence rate of LUT predistorter faster, and method thereof.

In accordance with one aspect of the present invention, there is provided a fast LUT predistortion apparatus including: a predistortion unit for predistorting an input complex digital signal based on a look up table LUT implementation and outputting a predistorted complex signal; and a power amplifier for amplifying the predistorted signal and outputting an amplified complex signal.

In accordance with another aspect of the present invention, there is provided a fast predistortion method including the steps of: an acquisition step for selecting look up table access points and performing a predistortion and updating operation with the selected access points; and a tracking step for performing the predistortion and updating operation with an input complex digital signal.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 1:
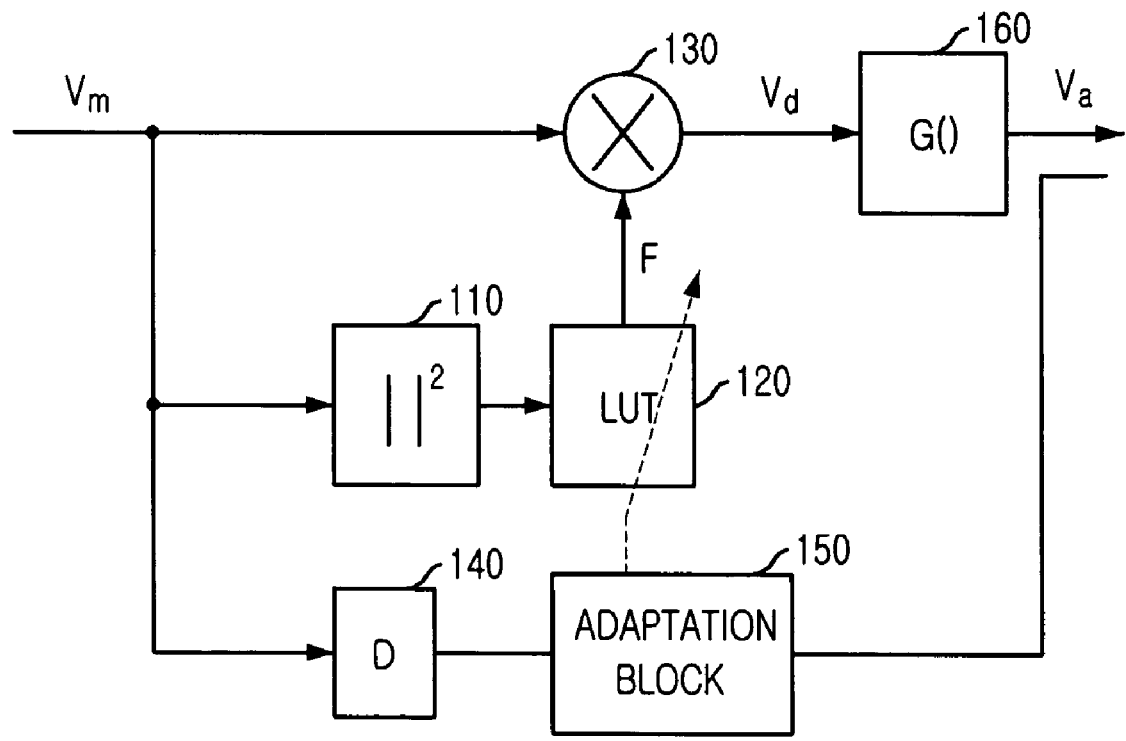
FIG. 1 is a block diagram illustrating a conventional adaptive complex gain LUT predistortion apparatus.

FIG. 1 shows a generic model for a prior art of an adaptive complex gain predistortion method which is disclosed in an article by J. Cavers, entitled "Amplifier Linearization using a Digital Predistorter with Fast Adaptation and Low memory Requirement", *IEEE Transactions on Vehicular Technology*, Vol. 39, No. 4, pp. 374–382, November 1990.

All signal designations employed herein refer either to complex baseband digital signals or to the complex envelope bandpass digital signals. In FIG. 1, $v_m$ is the complex input envelope to the predistorter, F is the complex gain value stored in a Look up table LUT 120, and $v_a$ is the complex envelope output of the amplifier 160. The power amplifier 160 has $G(\cdot)$ as its transfer function comprising of $A(\cdot)$ and $\Psi(\cdot)$, the AM/AM and AM/PM response functions of the HPA, respectively.

The LUT 110 is addressed by the square magnitude of $v_m$. The LUT's output F is the complex gain by which $v_m$ multiplied to yield $v_d$ as follows.

$$v_d = v_m \cdot F \quad \text{Eq. (1)}$$

Ideally, when $v_d$ is amplified by the HPA 160, thus undergoing nonlinear distortion, the resulting output signal $v_a$ is a constant multiple of $v_m$. It is expressed as:

$$v_a = v_m F(|v_m|^2) G(|v_m|^2 |F(|v_m|^2)|^2) = K v_m, \quad \text{Eq. (2)}$$

$$F(|v_m|^2) G(|v_m|^2 |F(|v_m|^2)|^2) = K, \quad \text{Eq. (3)}$$

The LUT 120 is updated by the adaptation block 150. The adaptation block 150 compares a delayed version of $v_m$ with $v_a$, i.e., adaptation is accomplished by minimizing the error signal, $e_g(F)$ expressed as:

$$e_g(F) = v_o(F) - K v_m = v_m F G(|v_m F|^2) - K v_m, \quad \text{Eq. (4)}$$

To update the look-up table (LUT 120) entries in the gain based predistortion, Cavers formulated the adaptation as a root finding problem of the error function given in Eq. (4) to which a number of classical methods can be applied. Since the derivative of $e_g(F)$ is not available, a secant method is used as follows:

$$F_{l+1}(k+1) = F_l(k) - e_g(F_l(k)) \cdot Y, \quad \text{Eq. (5)}$$

where $$Y = \frac{F_l(k) - F_l(k-1)}{e_g(F_l(k)) - e_g(F_l(k-1))}, \quad \text{Eq. (6)}$$

Cavers showed that above mentioned algorithm is worked well by using experimental results. However, it shows serious unstableness in the convergence rate with time varying input values.

Figure 2:
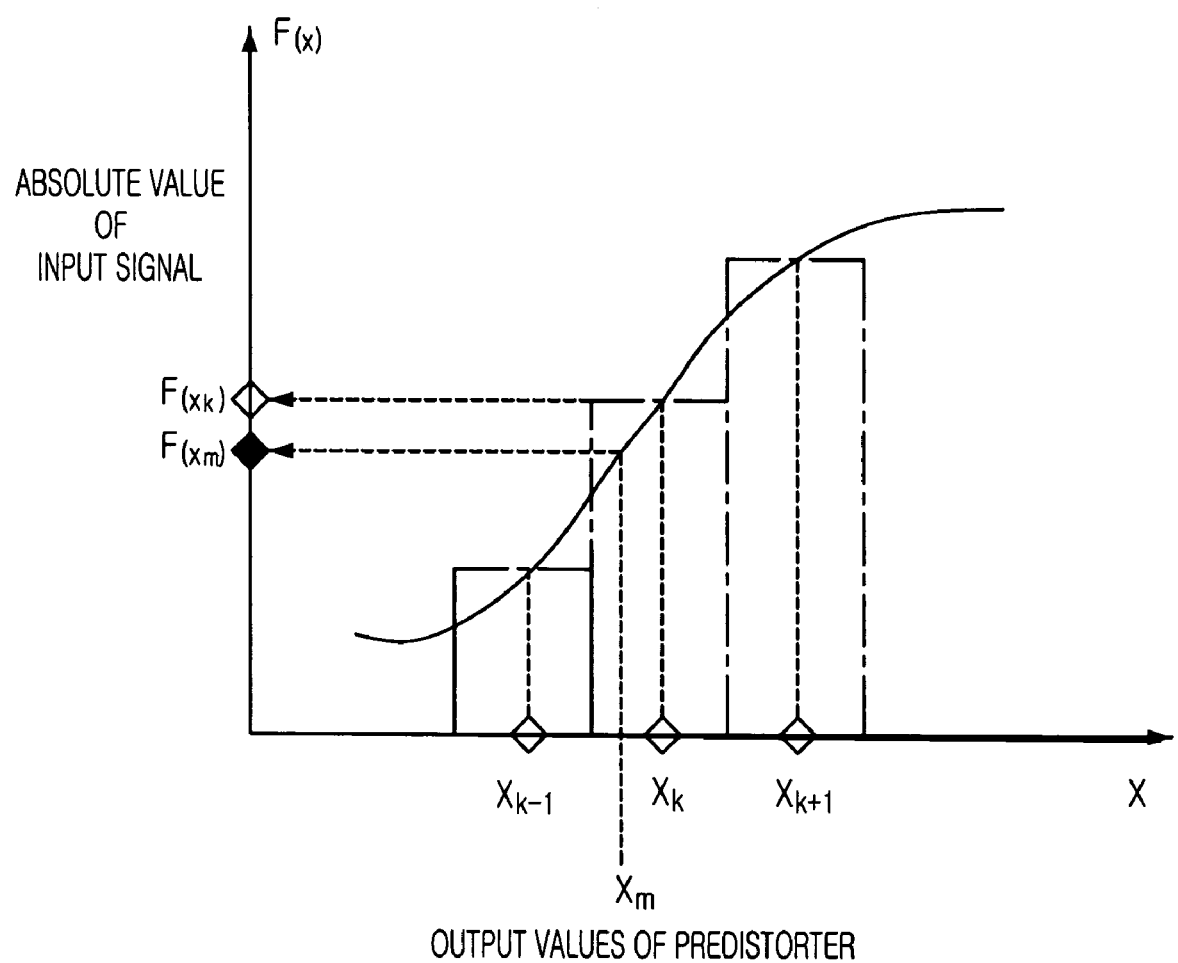
FIG. 2 is a graph exemplifying a plot showing input and output quantization error in amplitudes of an AM/AM transfer function of a predistorter.

The error function of Eq. (4) is a complex value function and is conditioned on the input signal $v_m$. Theoretically, the numerical methods for finding the root of Eq. (4) are only valid for a fixed value of $v_m$. For a given value of $v_m$, the error function in Eq. (4) is just a constant coefficient function of variable F, and there exist one root of (4) that could be solved by numerical methods. However, in real situation, the input signal $v_m$ to the predistorter dynamically varies and it is shown in FIG. 2.

For example, at time $t_1$ with input of $v_m(t_1)$, an error function is expressed as:

$$e_g(F, t_1) = v_m(t_1) F G(|v_m(t_1) F|^2) - K v_m(t_1) \quad \text{Eq. (7)}$$

And then the approximated value of root of error function Eq. (7) can be found, for example $F_1$, based on secant method and have another error function expressed as:

$$e_g(F_1, t_1) = v_m(t_1) F_1 G(|v_m(t_1) F_1|^2) - K v_m(t_1) \quad \text{Eq. (8)}$$

Also, another more accurate approximated value of root of error function Eq. (8) can be found, for example $F_2$ by secant method.

However, for real case, at the second time $t_2$, we do not have the same error function as Ea. (8), but have a different error function as expressed as:

$$e_g'(F_1, t_2) = v_m(t_2) F_1 G(|v_m(t_2) F_1|^2) - K v_m(t_2) \quad \text{Eq. (9)}$$

Therefore, the error function in Eq. (4) is not a constant coefficient function, but the error function is varied with the input signal. For this reason, the numerical method to find a root must be applied to different equations (although they may be similar each other) by time, and in addition it may result in divergence of the algorithm.

In general, the power amplifier has characteristics that is invariant to the phase of the input signal, but is very dependent on the envelope of the input signal. An ideal predistortion characteristic must have the inverse characteristics of the power amplifier that is also invariant to the phase of the input signal.

However, as shown in Eq. (4), the error signal used to modify the contents of the LUT depends on the phase of the input value, and it also affects the magnitude of the LUT entries. Therefore, to delete the phase affect, Cavers has given other error function in U.S. Pat. No. 5,049,832 as follows:

$$e_g(F) = (v_o(F) - K v_m) \cdot v_m^* = (v_m F G(|v_m F|^2) - K v_m) \cdot v_m^*, \quad \text{Eq. (10)}$$

wherein $v^*_m$ is a conjugate of $v_m$.

Because the function F must have the inverse characteristics of the amplifier gain function G, it would be better to use error signal that directly rely on the gain error. Thus, in accordance with preferred embodiment of the present invention, the error function is given as follows:

$$e_F(F) = (v_o(F) - Kv_m)/v_m \quad \text{Eq. (11)}$$
$$= v_o(F)/v_m - K$$
$$= FG(|v_mF|^2) - K$$

To update the table entries of the LUT in FIG. 1, the adaptation can be formulated as a root finding problem with error function of Eq. (11) to which a number of classical methods can be applied.

On the other hands, in order to improve convergence rate of the predistorter, an adaptive predistortion scheme is proposed in an article by Won-Gi Jeon, Kyung-Hi Chang and Yong-Soo Cho, entitled "An Adaptive Data Predistorter for Compensation of Nonlinear Distortion in OFDM systems", *IEEE Transaction on communications*, Vol. 45, No. 10, pp. 1167–1171, October 1997, which is referred as Jeon's method. The Jeon's method improve convergence rate of the predistorter by using a broadcasting technique and by designing appropriate training signals.

Figure 3:
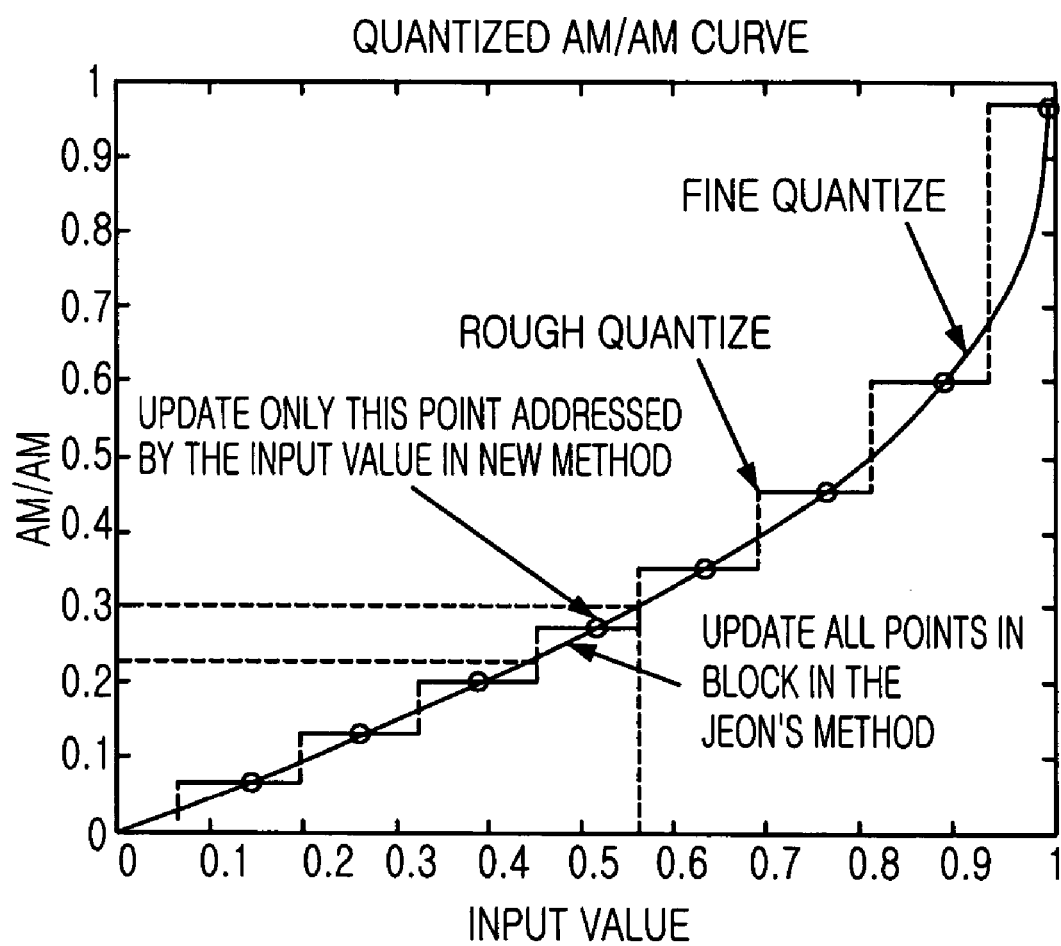
FIG. 3 is a graph for explaining a method of updating the contents of LUT predistorter in accordance with the preferred embodiment of the present invention and a conventional broadcasting method.

In the Jeon's method, the contents of LUT are divided into several groups and the contents in the same group are simultaneously updated whenever any of them is addressed by the input signal. It is shown in FIG. 3, At the beginning of the training mode, the contents of LUT are divided into small number of groups with large size for rough estimation and fast convergence, and then the size of group is gradually reduced and the number of groups is increased for accurate estimation. Finally, the group size is reduced to 1, i.e. there are no groups and each time there is only one content of LUT is updated.

Because the input signal value is not uniformly distributed, some points are frequently updated with accurate value without error. On the other hand, some other points in the same block are not updated accurately. Accordingly, the convergence rate of the predistorter becomes slower.

Moreover the frequently accessed points, particularly in the linear region of the amplifier, converge very fast and it dose not need further iterations to contribute to make the convergence rate of the predistorter faster.

Accordingly, it is not necessary to simultaneously process all points (contents) in the same group and it is more efficient to process a single point in each group for quick convergence on that point.

By considering above mentioned concepts, a various number of points are used to accelerate the convergence rate. At the beginning, a small number of points are selected and updated in the LUT addressed by the input value instead of updating all points in the LUT. After a certain number of iterations, for example 100, an interpolation is performed with these updated points to update all other points in the LUT. After interpolation, more other points are selected without selecting previous selected points and the update operation is performed on selected other points. After a certain number of iterations, another interpolation is performed with the selected points and then all points in the LUT are updated. Finally, there are no particularly selected fixed points to update, all points of LUT is updated independently whenever it addressed by input value and there are no interpolation operation.

Figure 4:
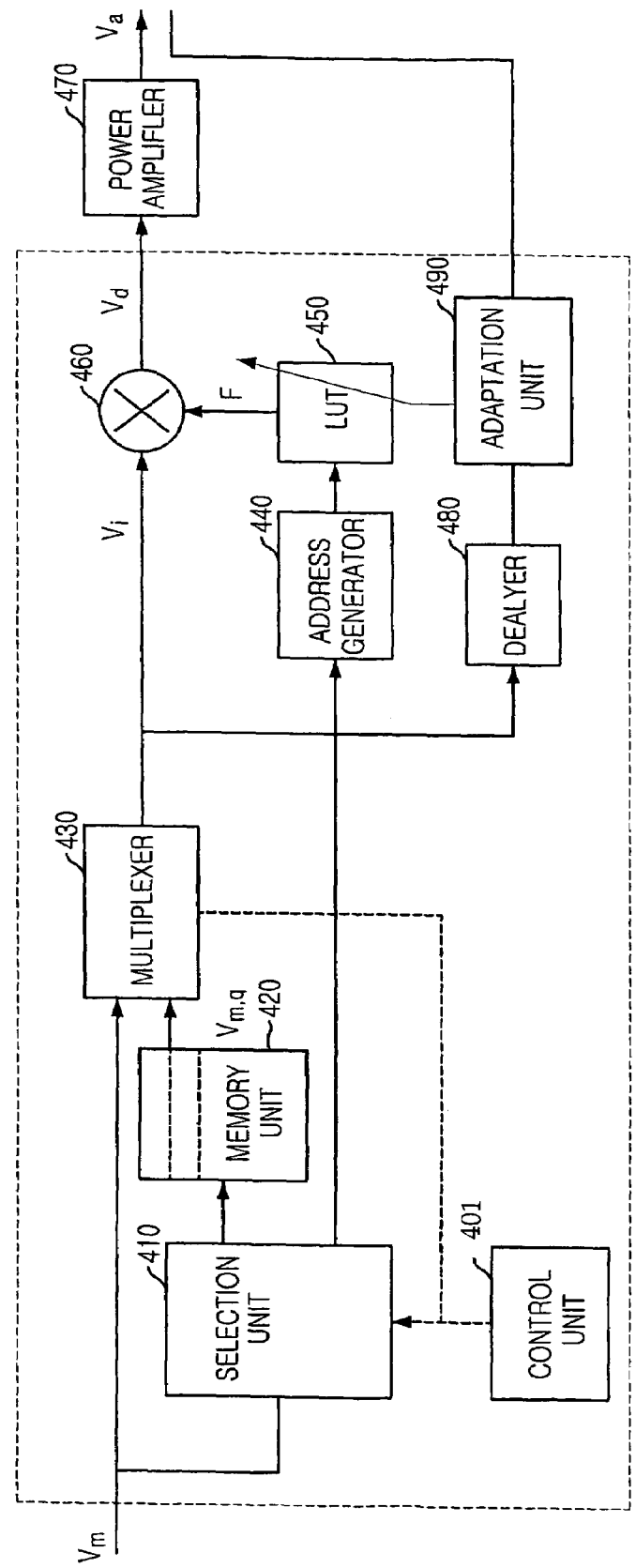
FIG. 4 illustrates a block diagram of a fast LUT predistorter in accordance with the preferred embodiment of the present invention.

FIG. 4 is a diagram illustrating a fast LUT predistorter in accordance with a preferred embodiment of the present invention.

As shown in FIG. 4, a predistortion apparatus 400 includes a control unit 401, a selection unit 410, a memory unit 420, a multiplexer 430, an address generator 440, a look up table (LUT) 450, a multiplier 460, a delayer 480 and a adaptation unit 490.

The selection unit 410 generates an access signal which is used to select a stored value in the memory unit 420. The selection unit 410 is also used to generate quartzite signal that is outputted to address generator 440.

The memory unit 420 stores values of input signal points that is considered important in convergence rate performance.

The multiplexer 430 selects one of an input signal $v_m$ or $v_{m,q}$, and outputs a selected input signal to the multiplier 460 and delayer 480.

The address generator 440 generates an address point in order to select the corresponding contents in LUT 450.

The LUT 450 stores the predistortion gain value of F which is used in the multiplier 460 for multiplying with an output signal of the multiplexer 430.

The multiplier 460 implements a multiplying function with input $v_i$ from multiplexer 430 and F from the LUT 450, and output a predistorted signal $v_d$ to the power amplifier 470.

The delayer 480 delays the input signal $v_i$ from the multiplexer 430 in order to match the feedback signal from the output signal $v_a$ of power amplifier.

The adaptation unit 490 calculates the error signal by comparing the $v_i$ and $v_a$ and update the contents of LUT by performing an adaptive operation. In addition, the adaptation unit 490 outputs an error state signal to the control unit 401.

The control unit 401 controls the selection unit 410 and multiplexer 430 according to the error signal state inputted from adaptation unit 490.

Figure 5:
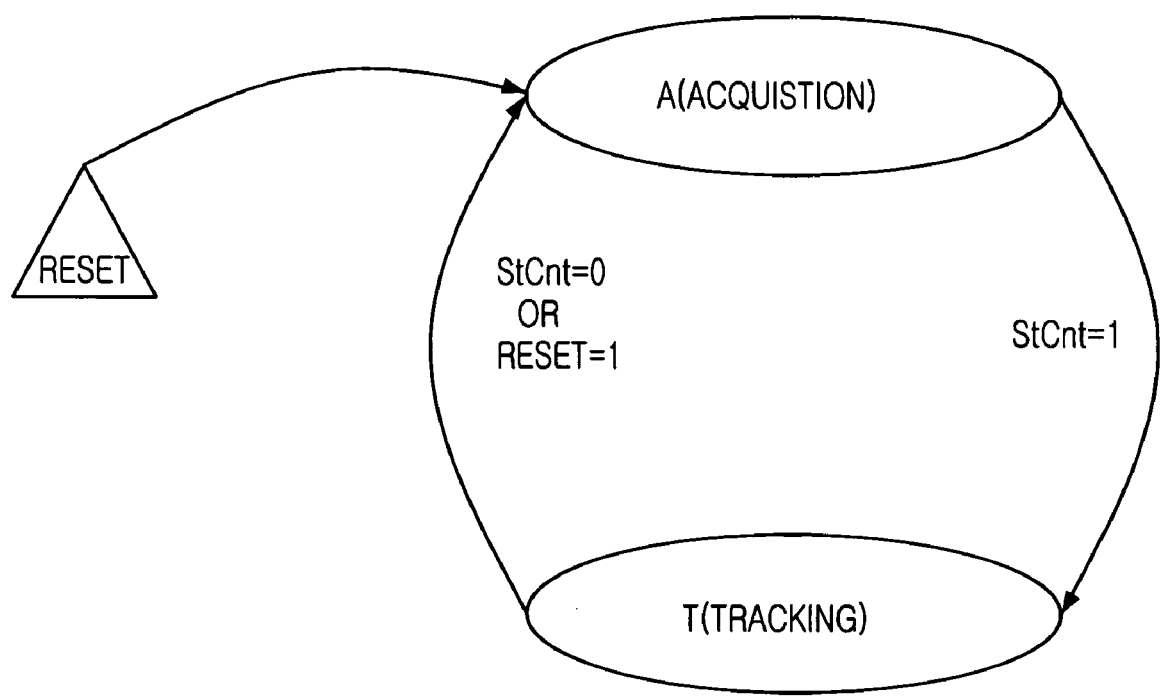
FIG. 5 is a state diagram of process of the fast LUT predistorter in accordance with the preferred embodiment of the present invention.

FIG. 5 is a state diagram of the predistortion in accordance with a preferred embodiment of the present invention.

Hereinafter, referring to FIG. 5, the operation of the fast LUT predistortion apparatus in FIG. 4 will be explained in detail.

A fast LUT predistortion apparatus process has two states, Acquisition state and Tracking state.

At the beginning of process, after power on of the system or with the reset command from the control unit 400, it enters Acquisition state and performs initial updating process in accordance with a preferred embodiment of the present invention, and then it enters the Tracking state and performs usual predistortion and updating operation.

To make the convergence rate of the contents of LUT 450 faster, an adaptive algorithm in accordance with a preferred embodiment of the present invention is used for dividing the input points in LUT 410 into several groups.

In the Acquisition state, the process as follows;

For i=1, 2, . . . , $N_g$
For j=1, 2, . . . , $N_i$
Perform predistortion and update process for each $j^{th}$ point in $i^{th}$ group until it converges.
End;
Perform linear interpolation
End;

where $N_g$ represents the number of performing grouping operations and $N_i$ denotes the number of groups in the $i^{th}$ grouping operations.

Figure 6:
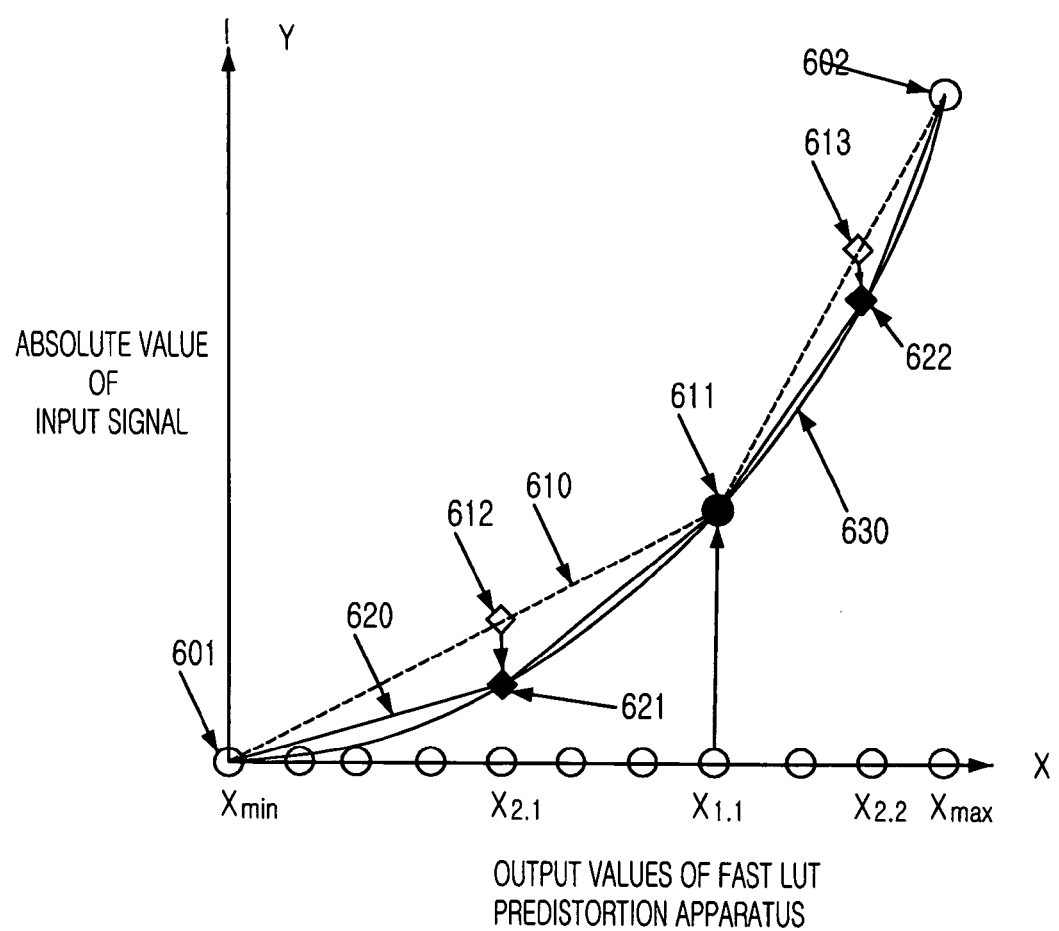
FIG. 6 is a graph exemplifying a plot showing updating method of a fast LUT predistorter in accordance with the preferred embodiment of the present invention.

FIG. 6 is a graph for explaining updating method of a fast LUT predistortion apparatus in accordance with a preferred embodiment of the present invention. For example, if the LUT 450 has dimension of 11, then there are 11 input points and the memory unit 420 stored 3 points which are divided into two groups with one point ($x_{1,1}$) in the $1^{st}$ group and with two points ($x_{2,1}$ and $x_{2,2}$) in the $2^{nd}$ group. It assumes that the LUT table is initialized with zero value (the worst case) and the minimum and maximum values of input and output of predistortion is known.

At the beginning of process, i.e., at the Acquisition state, the selection unit 410 in FIG. 2 selects point ($x_{1,1}$) and the output of memory unit 420 outputs $v_{m,q}$ that equals to the value of point ($x_{1,1}$). The multiplexer 430 in FIG. 2 also select signal $v_{m,q}$ and the predistortion and update operation is performed with the select signal $v_{m,q}$ until it converges to point 611 in FIG. 6. After convergence, it performs linear interpolation with point 601, point 602 and point 611 in FIG. 6 to get curve 610 in FIG. 6.

After obtaining the curve 610, the point $x_{2,1}$ and $x_{2,2}$, are selected and similar operation described in the above is performed until it converges. It is noted at this state, the contents pointed by the two point $x_{2,1}$ and $x_{2,2}$, are updated from point 612 and 613 respectively and convergent to point 621 and 622 respectively. By this way, the convergence rate of LUT contents pointed by these two point $x_{2,1}$ and $x_{2,2}$, is increased. After convergent of these two points, linear interpolation is performed again with points 601, 621, 611, 622 and 602 to obtain the curve of 620.

After all points in memory unit 420 in FIG. 4 have been processed, the state of the predistortion is entering into the Tracking state. In tracking state, the multiplexer 430 in FIG. 4 selects input signal $v_m$ and the selection unit 410 in FIG. 4 outputs quantized value of input signal $v_m$ to the address generator 440 in FIG. 4. The predistortion and update operation is not fixed to special point in LUT 450. Therefore, it randomly accesses to contents of LUT 450 and the corresponding contents of LUT 450 are updated.

While the present invention has been described with respect to certain preferred embodiments, it will be apparent to those skilled in the art that various changes and modifications may be made without departing from the scope of the invention as defined in the following claims.

What is claimed is:

1. A fast look up table (LUT) predistortion apparatus comprising:
    a predistortion means for predistorting an input complex digital signal based on an LUT implementation and outputting a predistorted complex signal; and
    a power amplifier for amplifying the predistorted signal and outputting an amplified complex signal,
  wherein the predistortion means includes:
    a selection unit for receiving the input complex digital signal, generating an access point and a quantized signal based on the input complex digital signal;
    a memory unit for storing values of the input complex digital signal corresponding to the accessing point from the selection unit and outputting a stored signal;
    a multiplexer for generating a multiplexed signal by selecting one of the stored signal and the input digital complex signal;
    a address generator for generating an access point according to the quantized signal from the selection unit;
    a LUT for storing complex gain values according to the access point from the address generator and outputting stored complex gain value;
    a multiplier for multiplying the multiplexed signal from the multiplexer and stored complex gain value from the LUT;
    a delayer for receiving the multiplexed signal, and generating a delayed signal by delaying the multiplexed signal to match a feedback signal from the power amplifier;
    a adaptation unit for calculating an error signal by comparing the delayed signal and the feedback signal and updating the complex gain values of the LUT; and
    a control unit for controlling the selection unit and multiplexer by state of the error signal from the adaptation unit.

2. The fast look up table predistortion apparatus of claim 1, wherein contents of the memory unit are subdivision points of the inverse characteristics of the power amplifier and is predefined in terms of characteristics of real power amplifier.

3. The fast look up table predistortion apparatus of claim 1, wherein the contents of look up table (LUT) a recalculated in terms of the inverse characteristics of the power amplifier that inducted from real measurement of characteristics of a real power amplifier or initialized by linear interpolation by minimum and maximum input-output value.

4. The fast look up table predistortion apparatus of claim 1, wherein the error signal $e_f(F)$ in the adaptation unit is calculated by a function as:

$$e_f(F) = \frac{v_a}{v_i - K}$$

where $v_i$ shows the input complex signal to multiplier, $v_a$ represents the feedback signal from output of power amplifier and K depicts the gain of power amplifier.

5. A fast look up table (LUT) predistortion method comprising:
    an acquisition step for selecting LUT access points and performing a predistortion and updating operation with the selected access points; and
    a tracking step for performing the predistortion and updating operation with an input complex digital signal
  wherein the acquisition step includes
    a reset step for performing the predistortion and updating operation without the input complex digital signal and generating accessing points to a memory unit in a predefined order; and
    an error severe step for performing the predistortion and updating operation with the input complex signal and generating accessing points to the memory unit based on values of the input complex digital signal.

6. The fast look up table predistortion method of claim 5, wherein the reset step is performed, if a system using the fast LUT predistortion method is powered on or reset.

7. The fast look up table predistortion method of claim 5, wherein the error severe step is performed, if an error calculated by an adaptation algorithm is greater than a predefined threshold.

8. The fast look up table predistortion method of claim 7, wherein the error calculated is an average error of several samples.

* * * * *